(12) United States Patent
Luo et al.

(10) Patent No.: US 11,562,980 B2
(45) Date of Patent: Jan. 24, 2023

(54) WAFER-LEVEL PACKAGE STRUCTURE

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 256 days.

(21) Appl. No.: 17/091,981

(22) Filed: Nov. 6, 2020

(65) Prior Publication Data
US 2021/0082869 A1 Mar. 18, 2021

Related U.S. Application Data

(60) Division of application No. 16/228,059, filed on Dec. 20, 2018, now Pat. No. 10,861,822, which is a
(Continued)

(30) Foreign Application Priority Data

Sep. 4, 2018 (CN) .......................... 201811026716.3

(51) Int. Cl.
*H01L 23/00* (2006.01)
*H01L 21/56* (2006.01)
(Continued)

(52) U.S. Cl.
CPC ............ *H01L 24/94* (2013.01); *H01L 21/244* (2013.01); *H01L 21/28568* (2013.01);
(Continued)

(58) Field of Classification Search
CPC ... H01L 24/94; H01L 21/244; H01L 23/3135; H01L 25/042; H01L 25/0655;
(Continued)

(56) References Cited

U.S. PATENT DOCUMENTS

| 7,161,252 B2 | 1/2007 | Tsuneoka et al. |
| 8,378,480 B2 | 2/2013 | Chen et al. |

(Continued)

FOREIGN PATENT DOCUMENTS

| CN | 101996900 A | 3/2011 |
| CN | 105575825 A | 5/2016 |

(Continued)

*Primary Examiner* — David A Zarneke
(74) *Attorney, Agent, or Firm* — Anova Law Group, PLLC

(57) ABSTRACT

Wafer-level packaging structure is provided. First chips are bonded to the device wafer. A first encapsulation layer is formed on the device wafer, covering the first chips. The first chip includes: a chip front surface with a formed first pad, facing the device wafer; and a chip back surface opposite to the chip front surface. A first opening is formed in the first encapsulation layer to expose at least one first chip having an exposed chip back surface for receiving a loading signal. A metal layer structure is formed covering the at least one first chip, a bottom and sidewalls of the first opening, and the first encapsulation layer, followed by an alloying treatment on the chip back surface and the metal layer structure to form a back metal layer on the chip back surface.

7 Claims, 5 Drawing Sheets

Related U.S. Application Data continuation of application No. PCT/CN2018/113107, filed on Oct. 31, 2018.

(51) Int. Cl.
| | |
|---|---|
| *H01L 21/285* | (2006.01) |
| *H01L 21/24* | (2006.01) |
| *H01L 23/31* | (2006.01) |
| *H01L 25/065* | (2006.01) |
| *H01L 25/00* | (2006.01) |
| *H01L 23/552* | (2006.01) |

(52) U.S. Cl.
CPC .......... *H01L 21/561* (2013.01); *H01L 21/565* (2013.01); *H01L 23/3135* (2013.01); *H01L 24/08* (2013.01); *H01L 24/80* (2013.01); *H01L 25/0652* (2013.01); *H01L 25/50* (2013.01); *H01L 23/552* (2013.01); *H01L 2224/08145* (2013.01); *H01L 2224/80894* (2013.01); *H01L 2225/06524* (2013.01); *H01L 2225/06527* (2013.01); *H01L 2225/06582* (2013.01)

(58) Field of Classification Search
CPC ............... H01L 25/072; H01L 25/0753; H01L 2225/06527; H01L 2224/94
See application file for complete search history.

(56) References Cited

U.S. PATENT DOCUMENTS

| | | | |
|---|---|---|---|
| 8,704,341 | B2 | 4/2014 | Lin et al. |
| 9,293,423 | B2 | 3/2016 | Brunnbauer et al. |
| 9,960,145 | B2 * | 5/2018 | Costa ...................... H01L 24/97 |
| 10,068,831 | B2 * | 9/2018 | Costa ...................... H01L 23/42 |
| 10,242,957 | B2 | 3/2019 | Kim et al. |
| 10,622,302 | B2 * | 4/2020 | Yu ..................... H01L 21/76819 |
| 2009/0079041 | A1 | 3/2009 | Huang et al. |
| 2012/0228751 | A1 | 9/2012 | Song |
| 2014/0093990 | A1 * | 4/2014 | Chen ..................... H01L 33/486 438/27 |
| 2015/0311188 | A1 | 10/2015 | Mao et al. |
| 2016/0254237 | A1 | 9/2016 | Kim et al. |
| 2019/0164902 | A1 | 5/2019 | Xiao et al. |
| 2019/0230781 | A1 | 7/2019 | Onodera |
| 2020/0058599 | A1 | 2/2020 | Okada et al. |

FOREIGN PATENT DOCUMENTS

| | | |
|---|---|---|
| CN | 107104094 A | 8/2017 |
| CN | 108346639 A | 7/2018 |
| TW | 200423264 A | 11/2004 |

\* cited by examiner

WAFER-LEVEL PACKAGE STRUCTURE

CROSS-REFERENCES TO RELATED APPLICATION

This application is a divisional of U.S. patent application Ser. No. 16/228,059, filed on Dec. 20, 2018, which is a continuation application of PCT Patent Application No. PCT/CN2018/113107, filed on Oct. 31, 2018, which claims priority to Chinese patent application No. 201811026716.3, filed on Sep. 4, 2018, the entirety of all of which is incorporated herein by reference.

TECHNICAL FIELD

The present disclosure generally relates to the field of semiconductor technologies and, more particularly, relates to a wafer-level package structure.

BACKGROUND

With the development of ultra-large-scale integrated circuits, the feature size of integrated circuits continues to decrease and requirements for packaging technologies of integrated circuits are increasing correspondingly. Conventional packaging technologies include ball grid array package (BGA), chip scale package (CSP), wafer level package (WLP), three-dimensional (3D) package and system-in-package (SiP), etc.

At present, in order to meet the goal of low cost, high reliability, fast package and high density of integrated circuit packaging, advanced packaging methods mainly use wafer-level system-in-package (WLSiP). Comparing with conventional system-in-package, wafer-level system-in-package, a packaging integration process is completed on wafers, which has advantages including greatly reducing the area of package structures, reducing manufacturing costs, optimizing electrical performance and performing batch manufacturing, etc. This may significantly reduce workload and equipment requirements.

SUMMARY

One aspect of the present disclosure includes a wafer-level packaging method. The method includes: providing a device wafer and a plurality of first chips bonded to the device wafer, where a first encapsulation layer covering the first chips is on the device wafer, the first chip of the plurality of first chips includes a chip front surface with a formed first pad and a chip back surface opposite to the chip front surface, and the chip front surface faces the device wafer; etching the first encapsulation layer to form a first opening exposing at least one first chip of the plurality of first chips in the first encapsulation layer, where the chip back surface exposed by the first opening is used for receiving a loading signal; forming a metal layer structure covering the at least one first chip exposed by the first opening, a bottom and sidewalls of the first opening and a top of the first encapsulation layer; performing an alloying treatment on the chip back surface of the at least one first chip and the metal layer structure, where a portion of the metal layer structure on the chip back surface becomes a back metal layer; and after the alloying treatment, forming a second encapsulation layer covering the back metal layer in the first opening, where the second encapsulation layer further covers a remaining portion of the metal layer structure on the top of the first encapsulation layer.

Another aspect of the present disclosure includes a wafer-level package structure. The structure includes: a device wafer; a plurality of first chips, bonded to the device wafer, where the first chip of the plurality of first chips includes a chip front surface with a formed first pad and a chip back surface opposite to the chip front surface, and the chip front surface faces the device wafer; a first encapsulation layer, formed on the device wafer and covering the first chips, where the first encapsulation layer has a first opening exposing at least one first chip of the plurality of first chips and the chip back surface exposed by the first opening is connected to a loading signal; a metal layer structure, covering the at least one first chip exposed by the first opening, a bottom and sidewalls of the first opening and a top of the first encapsulation layer, where the metal layer structure includes a back metal layer alloyed with the chip back surface by an alloying treatment between the chip back surface and a portion of the metal layer structure on the chip back surface; and a second encapsulation layer, formed in the first opening, covering the back metal layer, and further covering the metal layer structure on the top of the first encapsulation layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The wafer-level packaging structures mainly include a device wafer and a plurality of chips bonded to the device wafer, and further include an encapsulation layer which is on the device wafer and covers the chips. The encapsulation layer covers the chips. Therefore, in the wafer-level packaging structures, it is difficult to load a signal (for example, a ground signal or a voltage signal) to a back surface of the chips.

The present disclosure provides a wafer-level packaging method and a wafer-level package structure, which may improve the performance of the wafer-level package structures.

An exemplary wafer-level packaging method may include: after etching a first encapsulation layer to expose a chip back surface of a first chip which is used for a loading signal, forming a metal layer structure covering the first chip exposed by the first opening, a bottom and sidewalls of the first opening and a top of the first encapsulation layer;

performing an alloying treatment on the chip back surface and the metal layer structure where the metal layer structure on the chip back surface is used as a back metal layer; and forming a second encapsulation layer covering the back metal layer. The back metal layer may be used as a back electrode of the first chip, which may load a signal (for example a ground signal) on the chip back surface suitable for loading signals according to actual process requirements, and may further improve the performance of wafer-level packaging structures.

To more clearly describe the objectives, features and advantages of the present disclosure, the present disclosure is further illustrated in detail with reference to the accompanying drawings in conjunction with embodiments.

FIGS. 1-7 illustrate structural schematics corresponding to structures at certain stages of an exemplary wafer-level packaging method according to various disclosed embodiments of the present disclosure.

Figure 1:
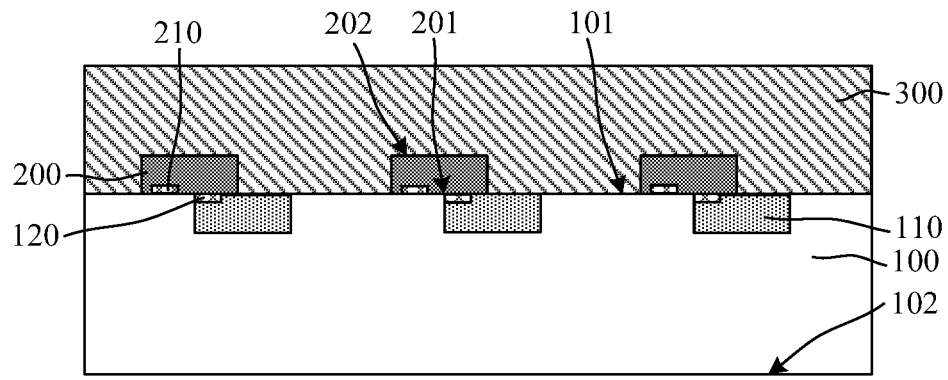
FIGS. 1-7 illustrate structural schematics corresponding to structures at certain stages of an exemplary wafer-level packaging method according to various disclosed embodiments of the present disclosure.

Referring to FIG. 1, a complimentary metal-oxide-semiconductor (CMOS) device wafer and a plurality of first chips 200 bonded to the device wafer may be provided. The device wafer 100 may have a first encapsulation layer 300 covering the first chips 200. The first chip 200 may include a first chip front surface 201 with a formed first pad 210 and a first chip back surface 202 opposite to the first chip front surface 201, where the first chip front surface 201 may face the device wafer 100.

In one embodiment, the wafer-level packaging method may be used to implement the wafer-level system-in-package. The device wafer 100 may be the wafer for a device completion. The device wafer 100 may be fabricated using an integrated circuit fabrication technology. For example, a device including an n-channel metal-oxide-semiconductor (NMOS) device or a p-channel metal-oxide-semiconductor (PMOS) device may be formed on a semiconductor substrate using a process including deposition and etching etc., where structures including a dielectric layer, a metal interconnection structure and a pad electrically connected to the metal interconnection structure may be formed on the device.

In one embodiment, a plurality of second chips 110 may be integrated in the device wafer 100 and a second pad 120 may be formed in the second chip 110, where the plurality of the second chips 110 may be the same type or different types of chips.

In one embodiment, the second pad 120 may be a bond pad of the device wafer 100 and may be used to implement an electrical connection between the second chip 110 and other circuits.

It should be noted that, in one embodiment, in order to facilitate illustrations, three second chips 110 integrated in the device wafer 100 are taken as an example for description, but the number of the second chips 110 is not limited to three.

In one embodiment, a semiconductor substrate of the device wafer 10 may be a silicon substrate. In other embodiments, the semiconductor substrate may be made of a material including germanium, silicon germanium, silicon carbide, gallium arsenide, indium gallium and/or any other suitable material(s). The semiconductor substrate may also be made of a material including a silicon substrate on an insulator, a germanium substrate on an insulator, and/or any other suitable material(s). The material of the semiconductor substrate may be a material suitable for process requirements or easy to integrate.

In one embodiment, the device wafer 100 may include a wafer front surface 101 exposing the second pad 120 and a wafer back surface 102 opposite to the wafer front surface 101. The plurality of the first chips 200 may be bonded to the wafer front surface 101 of the device wafer 100. The wafer back surface 102 may refer to a bottom surface, which is away from the second pad 120, of the semiconductor substrate in the device wafer 100.

The first chips 200 may the chips to-be-integrated and the first chips 200 may be one or more components including active components, passive components, microelectron-mechanical systems, and optical components. For example, the first chips 200 may be memory chips, communication chips, processing chips, flash chips or logic chips. In other embodiments, the first chips may also be other functional chips.

In one embodiment, the wafer-level packaging method may be used to combine the plurality of the first chips 200 of different functions into one packaging structure, so the plurality of the first chips 200 may be obtained by cutting a plurality of wafers of different functional types. In other embodiments, the functional types of the plurality of the first chips may be the same according to actual processing requirements.

It should be noted that, in one embodiment, the wafer-level packaging method may be used to implement heterogeneous integration, so the plurality of the first chips 200 may be chips made of silicon wafers. In other embodiments, the plurality of the first chips 200 may be also chips made of other suitable materials.

The first chips 200 may have the same number of the second chips 110. The first chips 200 may have a one-to-one correspondence with the second chips 110 and may have preset relative positional relationship. In one embodiment, the projection of the first chip 200 on the device wafer 100 may partially overlap with the second chip 110. In other embodiments, the first chip may also be aligned with the corresponding second chip, that is, the projection of the first chip on the device wafer may coincide with the second chip.

The first chips 200 may be fabricated using an integrated circuit fabrication technology. The first chip 200 may generally include an NMOS device or a PMOS device formed on a semiconductor substrate, and may further include structures including a dielectric layer, a metal interconnection structure and a pad.

The first pad 210 may be formed in the first chip 200. The first chip front surface 201 of the first chip 200 may expose the first pad 210 and the first pad 210 may be used to implement an electrical connection between the first chip 200 and other circuits. In one embodiment, the first pad may be a bond pad.

In one embodiment, the step of providing the device wafer 100 and the plurality of the first chips 200 bonded to the device wafer 100 may include: bonding the first chips 200 to the device wafer 100 using a fusion bonding process.

The fusion bonding may be a process that primarily uses interface chemical force to complete the bonding. Using the fusion bonding process, the first chip front surface 201 and the wafer back surface 101 may be bonded by covalent bonding, so the bonding strength between the device wafer 100 and the first chips 200 may be relatively high, which may improve the packaging yield. In other embodiments, the device wafer and the first chips may be bonded by other bonding methods such as adhesive bonding and glass dielectric bonding.

The first encapsulation layer 300 may cover the first chips 200 and the wafer front surfaces 101 of the device wafer 100, which may be used for sealing and moisture proof. The first encapsulation layer 300 may protect the first chips 200 and the second chips 110, so it may reduce a probability of the first chips 200 and the second chips 110 being damaged, contaminated or oxidized, which may facilitate optimizing of the performance of the obtained wafer-level packaging structure.

In one embodiment, the first encapsulation layer 300 may be made of epoxy resin (Epoxy). Epoxy resin has advantages of low shrinkage, good adhesion, good corrosion resistance, excellent electrical properties and low cost, and is widely used a packaging material for electronic devices and integrated circuits. In other embodiments, the first encapsulation layer may be made of a thermosetting material including polyimide or silica gel.

In one embodiment, the first encapsulation layer 300 may be formed by an injection molding process. The injection molding process may have good filling performance, so that the first encapsulation layer 300 may be better filled between the plurality of the first chips 200 and have a good packaging on the first chips 200 and the second chips 110.

For example, the first encapsulation layer 300 may be formed by liquid molding compounds or solid molding compounds by the injection molding process. The first encapsulation layer 300 may have a wafer shape, and a diameter of the wafer-shaped encapsulation layer 300 may be the same as a diameter of the device wafer 100. In other embodiments, the first encapsulation layer may be other suitable shapes and may be formed by other packaging processes.

Figure 2:
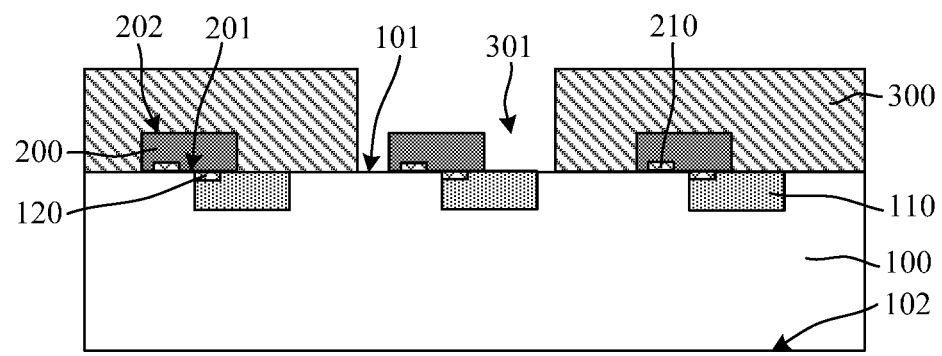

Referring to FIG. 2, the first encapsulation layer 300 may be etched. A first opening 301 exposing at least one first chip 200 may be formed in the first encapsulation layer 300 and the first chip back surface 202 exposed by the first opening 301 may be used for receiving one or more loading signals.

By exposing the first chip back surface 202 for loading signals, a process basis may be provided for subsequent formation of the back metal layer on the first chip back surface 202, where the back metal layer may be used as a back electrode of the first chip 200 which is used for receiving the loading signal.

It should be noted that, in order to reduce the process difficulty of etching the first encapsulation layer 300, the bottom of the first opening 301 may expose a portion of the device wafer 100, so that the wafer front surface 101 may be used as a stop position.

In one embodiment, the loading signal may be a ground signal, that is, the back metal layer subsequently formed on the first chip back surface 202 may be connected to a ground end, so that the first opening 301 may not expose the second pad 120 of the second chip 110 to avoid affecting the second chip 100 corresponding to the first chip 200.

For example, the first encapsulation layer 300 may be etched by a laser etching process.

The laser etching process may use a high-energy laser beam to irradiate a surface of a workpiece to-be-etched, which may melt, vaporize the workpiece surface to form a trench with a certain depth to achieve the purpose of etching. The laser etching process may achieve one-time forming technology with different angles and patterns, without using a mask plate. The laser etching process may have features including high etching yield rate, high stability, good flexibility, no supplies, simple operation, no contact, no pollution, high precision and low cost etc. Using the laser etching process, a size of the first opening 301 may be controlled precisely and the topography quality of the first opening 301 may be improved, which may reduce the probability that the adjacent first chips 200 or second chips 110 may be exposed.

In other embodiments, the process of etching the first encapsulation layer may also be a plasma etching process or a reactive ion etching process.

Figure 3:
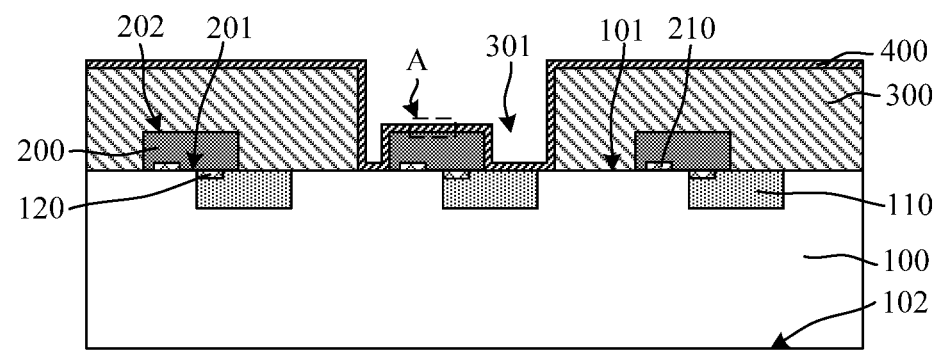
Figure 4:
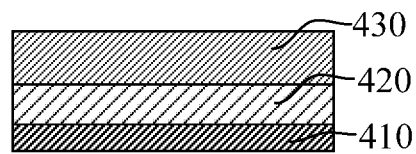

Referring to FIG. 3 and FIG. 4, FIG. 4 may be an enlarged view of the metal layer structure in the broken line box A in FIG. 3, and the metal layer structure 400 may be formed by covering the first chip 200 exposed by the first opening 301, a bottom and sidewalls of the first opening 301 and a top of the first encapsulation layer 300.

After a subsequent alloying treatment, the metal layer structure 400 on the first chip back surface 202 may become a back metal layer, which may be an electrode for loading ground signals.

In order to improve the performance of the subsequent metal layer and reduce the adverse effect on the first chip 200, the metal layer structure 400 may have low contact resistance and thermal resistance, low thermal stress and high reliability. Furthermore, in order to ensure excellent electrical performance, the metal layer structure 400 may have excellent conductive property and may be capable of forming an ohmic contact with the first chip back surface 202.

In one embodiment, the metal layer structure 400 may be a multiple-layered metal structure, so that the properties of different metals may be utilized to make subsequently formed electrodes meet process requirements.

For example, the metal layer structure 400 may include a bottom metal layer 410, a transition metal layer 420 on the bottom metal layer, and a top metal layer 430 on the transition metal layer.

The material of the bottom metal layer 410 may be a low potential barrier material and the contact resistance with the first chip back surface 202 may be relatively small. The material of the bottom metal layer 410 and the material of the first chip back surface 202 may have good formed alloy properties, which may be used as an ohmic contact layer.

In one embodiment, the material of the bottom metal layer 410 may be Ti. Ti and the material of the first chip back surface 202 may have good formed alloy properties, which may form an ohmic contact easily and also may have low process difficulty to form relatively high purity Ti. Therefore, selecting Ti as the material of the bottom metal layer 410 may also lower the process difficulty to form the metal layer structure 400. Furthermore, the chemical and mechanical properties of Ti may be relatively stable and the material of the first chip back surface 202 may have a good thermal matching with Ti, which may significantly improve the performance and reliability of the wafer-level packaging structure.

In other embodiments, the bottom metal layer may also be made of a material including Cr, Al or V.

The greater the thickness of the bottom metal layer 410, the greater the resistance of the bottom metal layer 410. Therefore, the thickness of the bottom metal layer 410 may not be too large, otherwise the performance and reliability of the wafer-level packaging structure may be reduced easily and process resources may be wasted. However, the thickness of the bottom metal layer 410 may not be too small. If the thickness of the bottom metal layer 410 is too small, the effect of the subsequent alloying treatment may be reduced easily, and the performance and reliability of the wafer-level packaging structure may also be reduced accordingly. In one embodiment, the thickness of the bottom metal layer 410 may be of about 1000 Å to 5000 Å.

The top metal layer 430 may have features of low resistivity, strong anti-electromigration performance, stable performance and difficulty in oxidation etc., so the top metal layer may function as a conductive layer, may protect the transition metal layer 420 and reduce the oxidation probability of the transition metal layer 420.

In one embodiment, the material of the top metal layer 430 may be Ag. Ag may be a material which is commonly used in the process and has a low cost. Therefore, Ag may be selected as the material of the top metal layer 430, which may reduce the process difficulty and process cost. In other embodiments, the material of the top metal layer may also be Au.

The thickness of the top metal layer 430 may be relatively large, which may effectively improve the protection on the transition metal layer 420 and may improve the reliability of the back metal layer when a ground signal is loaded on the subsequently formed back metal layer, so the performance stability of the wafer-level packaging structure may be improved; however, the thickness of the top metal layer 430 may not be too large. If the thickness of the top metal layer 430 is too large, the resistance of the top metal layer 430 may be too large, which may reduce the performance and reliability of the wafer-level packaging structure and may waste process resources. In one embodiment, the thickness of the top metal layer 430 may be of about 1000 Å to about 50000 Å.

The transition metal layer 420 may block the diffusion of the material of the top metal layer 430 into the bottom metal layer 410, and the expansion coefficient of the transition metal layer 420 may be between the expansion coefficients of the top metal layer 430 and the bottom metal layer 410. The transition metal layer may have moderate electrical conductivity and thermal conductivity, which may achieve a good thermal matching. In addition, the transition metal layer 420 may have good adhesion with the bottom metal layer 410 and the top metal layer 430, which may have the advantage of the improvement of the formation quality of the metal layer structure 400 and the reduced probability of falling off between the metal layers. In one embodiment, the material of the transition metal layer 420 may be Ni.

Correspondingly, in order to perform an excellent thermal matching and blocking effect of the transition metal layer 420, the thickness of the transition metal layer 420 may greater than the thickness of the bottom metal layer 410 and the thickness of the transition metal layer 420 may be less than the thickness of the top metal layer 430. In one embodiment, according to the thicknesses of the bottom metal layer 410 and the top metal layer 430, the thickness of the transition metal layer 420 may be of about 1000 Å to about 5000 Å.

Each of the bottom metal layer 410, the transition metal layer 420 and the top metal layer 430 may be formed by one of an electroplating process, a physical gas deposition process and an electron beam evaporation process. In order to improve the performance of the metal layer structure 400, the formation processes of the bottom metal layer 410, the transition metal layer 420 and the top metal layer 430 may be the same, which may ensure good quality and topography and may better control the thickness of each metal layer.

In one embodiment, the bottom metal layer, the transition metal layer and the top metal layer may be formed using the electroplating process, which may improve adhesion and mechanical strength of each metal layer. Correspondingly, the metal layer structure 400 may conformally cover the first chip 200, the bottom and sidewalls of the first opening 301 and the top of the first encapsulation layer 300. In other embodiments, the metal layer structure may also be filled in the first opening.

Figure 5:
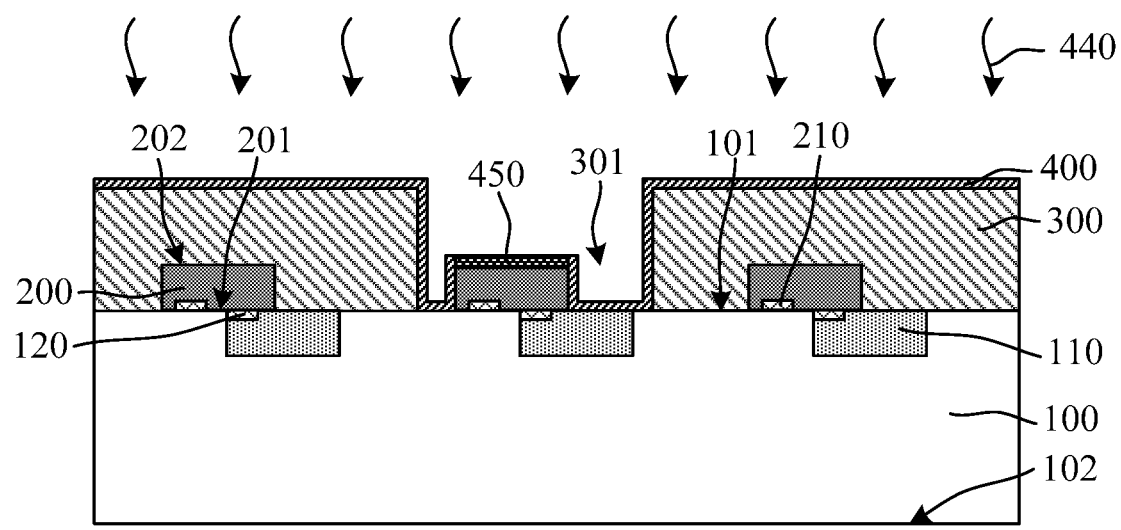

Referring to FIG. 5, the first chip back surface 202 and the metal layer structure 400 may perform an alloying treatment 440, and the metal layer structure 400 of the first chip back surface 202 may become a back metal layer 450.

The back metal layer 450 may be used as an electrode for loading ground signals. Itself resistance of the first chip 200 and a contact resistance of the electrode may be reduced by using the alloying treatment 440, and a ground resistance may be reduced correspondingly, which may reduce the loss of electrical energy and improve the performance and reliability of the wafer-level packaging structure.

In one embodiment, the alloying treatment 440 may be an annealing process. At the temperature of the annealing process, the bottom metal layer 410 (shown in FIG. 4) and the material of the first chip back surface 202 may mutually diffuse and react with each other at the contact surface, and achieve alloying at the contact surface.

For example, the material of the bottom back metal layer 410 may be Ti. The semiconductor substrate of the first chip 200 may be a silicon substrate. Correspondingly, after the alloying treatment 440, a TiSi alloy may be formed at the contact surface to form an ohmic contact.

In one embodiment, after the alloying treatment 440, the metal layer structure 400 of the first chip back surface 202 may become the back metal layer 450.

The processing temperature of the alloying treatment 440 may be not too low or not too high. If the processing temperature is too low, a alloying rate between the bottom metal layer 410 and the first chip back surface 202 may be slow, which may be disadvantageous to reduce contact resistance and may easily reduce the performance of the wafer-level packaging structure; and if the processing temperature is too high, it may adversely affect the performance of devices in the first chips 200 and the second chips 110, and may also easily reduce the performance of the wafer-level packaging structure. In one embodiment, the processing temperature of the alloying treatment 440 may be of about 100° C. to about 250° C.

The processing time of the alloying treatment 440 may be not too short or not too long. If the processing time is too short, it may be difficult to provide sufficient time for the alloying at the contact surface of the bottom metal layer 410 and the first chip back surface 202, which may be disadvantageous to reduce contact resistance and may easily reduce the performance of the wafer-level packaging structure; and if the processing time is too long, it may increase the thermal budget and decrease the efficiency accordingly, and also may adversely affect the performance of devices in the first chips 200 and the second chips 110. In one embodiment, the processing time of the alloying treatment 440 may be of about 30 min to about 160 min.

In one embodiment, by appropriately setting the process parameters of the alloying treatment 440 and coordinating the processing temperature and the processing time, the efficiency of the alloying treatment may be improved and the probability of negative effects may be reduced when the alloying is achieved efficiently.

It should be noted that, in one embodiment, the firstly formed metal layer structure 400 and the subsequently performed alloying treatment 400 may be used as an example for description. In other embodiments, in the step of forming the metal layer structure on the chip back surface exposed by the first opening, the metal layer structure may be a single metal layer. In one embodiment, the single metal layer may be substantially same as the above described bottom metal layer. Correspondingly, after the alloying treatment, the method may further include: forming the transition metal layer on the bottom metal layer, forming the top metal layer on the transition metal layer, and using the top metal layer, the transition metal layer and the bottom metal layer with the alloying treatment as the back metal layer.

By performing the alloying treatment before the formation of the transition metal layer and the top metal layer, it may be advantageous to reduce the difficulty of the alloying treatment, which may implement the alloying treatment efficiently and significantly.

Figure 6:
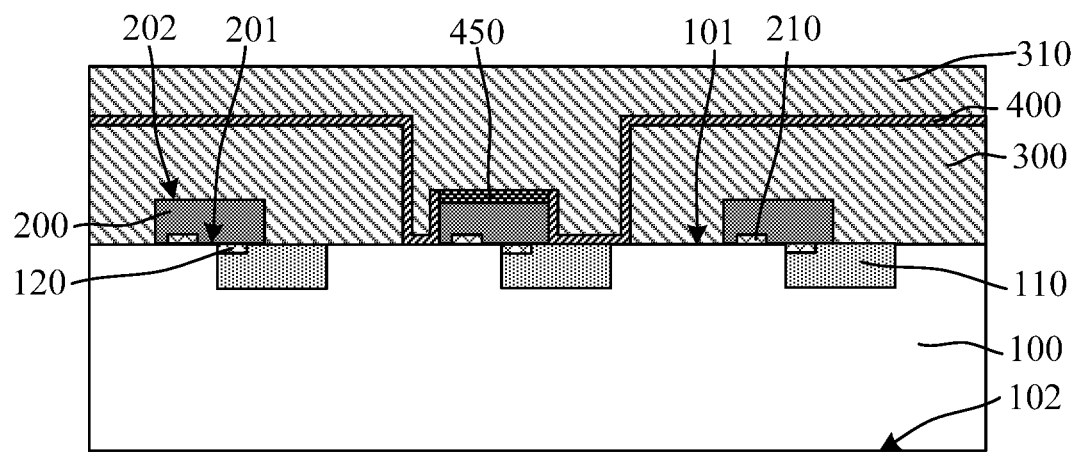

Referring to FIG. 6, after the alloying treatment 440 (shown in FIG. 5), a second encapsulation layer 310 covering the back metal layer 450 may be formed in the first opening 301 (shown in FIG. 5). The second encapsulation layer 310 may also cover the metal layer structure 400 on the top of the first encapsulation layer 300.

The second encapsulation layer 310 may be used to protect the metal layer structure 400 which is not alloyed and the back metal layer 450, which may prevent an external environment from affecting the metal layer structure 400 and the back metal layer 450, and further avoid an impact on the performance of the wafer-level packaging structure.

The detailed description of the second encapsulation layer 310 should refer to the above-mentioned corresponding description of the first encapsulation 300, which is not described herein.

It should be noted that, after forming the second encapsulation layer 310, the method may further include: thinning the device wafer 100 from the wafer back surface 102, and forming a silicon through hole interconnection structure in the device wafer 100 after the thinning treatment, which may be electrically connected to the second chip 110. In one embodiment, details may not be described herein.

Figure 7:
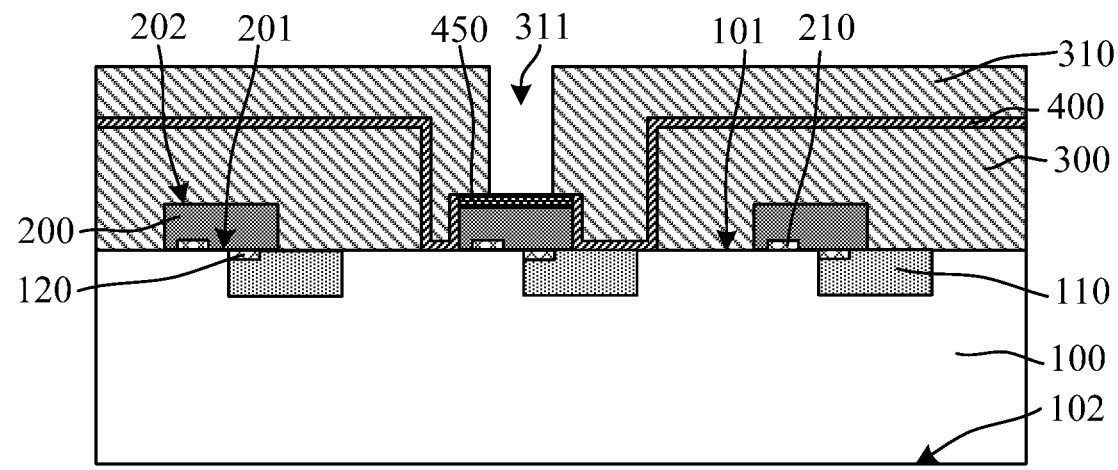

Referring to FIG. 7, in one embodiment, after forming the second encapsulation layer 310, the method may further include: etching the second encapsulation layer 310, and forming a second opening 311 exposing the back metal layer 450 in the second encapsulation layer 310.

After forming the second opening 311, the second opening 311 may expose the back metal layer 450, which may achieve electrical connections between the back metal layer 450 and other circuits.

In one embodiment, the second opening 311 may expose a portion surface of the back metal layer 450. In other embodiments, according to the actual process, the second opening may expose the entire surface of the back metal layer.

In one embodiment, the second encapsulation layer 310 may be etched by a laser etching process. In other embodiments, the second encapsulation layer may be etched by a plasma etching process or a reactive ion etching process.

The detailed process description for etching the second encapsulation layer 310 may refer to the corresponding above-mentioned process description for etching the first encapsulation layer 300, and details may be not described herein.

FIGS. 8-11 illustrate structural schematics corresponding to structures at certain stages of another exemplary wafer-level packaging method according to various disclosed embodiments of the present disclosure.

The similarity between the present embodiment and the previous embodiment may be not described herein. The difference between the present embodiment and the previous embodiment is: a loading signal may be a voltage signal.

Figure 8:
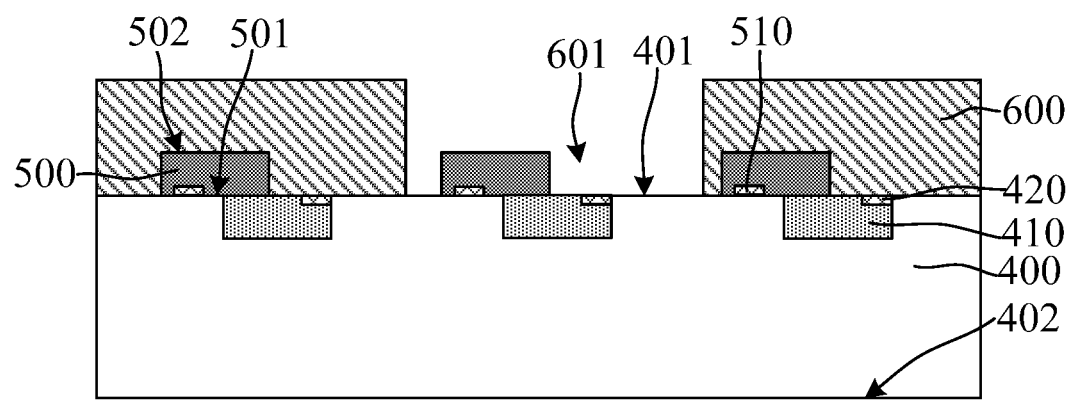
FIGS. 8-11 illustrate structural schematics corresponding to structures at certain stages of another exemplary wafer-level packaging method according to various disclosed embodiments of the present disclosure.

Correspondingly, referring to FIG. 8, after etching an first encapsulation layer 600, an opening 601 may be formed in the first encapsulation layer 600, and the opening 601 may expose a second pad 420 of a second chip 410.

Exposing the second pad 420 may provide a process basis for the subsequent electrical connection between the first chip back surface 502 of a first chip 500 and the second pad 420.

For example, forming the opening 601 may include: providing a device wafer 400 and a plurality of first chips 500 bonded to the device wafer 400; forming the first encapsulation layer 600 covering the first chips 500 on the device wafer 400, where the first chip 500 may include a first chip front surface 501 with a formed pad 510 and a first chip back surface 502 opposite to the first chip front surface 501, and the first chip front surface 501 may face the device wafer 400; etching the first encapsulation layer 600 and forming the opening 601, exposing at least one first chip 500, in the first encapsulation layer 600; and exposing the second pad 420 of the second chip 410 corresponding to the first chip 500 by the opening 601, where the first chip back surface 502 exposed by the opening 601 may be used for loading a voltage signal.

In one embodiment, the first chips 500 may be bonded to the device wafer 400 by a fusion bonding process, so that it may improve a bonding strength between the device wafer 400 and the first chips 500, which may be advantageous to improve the packaging yield and the performance of the wafer-level packaging structure correspondingly.

In one embodiment, the device wafer 400 may include a wafer front surface 401 exposing the second pad 420 and a wafer back surface 402 opposite to the wafer front surface 401, and the plurality of the first chips 500 may bonded to the wafer front surface 401 of the device wafer 400.

It should be noted that, in the process of forming the device wafer 400, the wafer front surface 401 may expose the second pad 420 and a position of the second pad 420 on the second chip 410 may be determined by a position of the first chip 500 on the wafer front surface 401, so that the first chip 500 may expose the second pad 420 after the first chip 500 is bonded to the device wafer 400. Correspondingly, after forming the opening 601 in the first encapsulation layer 600, the opening 601 may expose the second pad 420, which may reduce the process difficulty of exposing the second pad 420.

The detailed description of the device wafer 400, the first chips 500, the first encapsulation layer 600 and the opening 601 may refer to the corresponding description in above-mentioned embodiment. Details may not be described herein.

Figure 9:
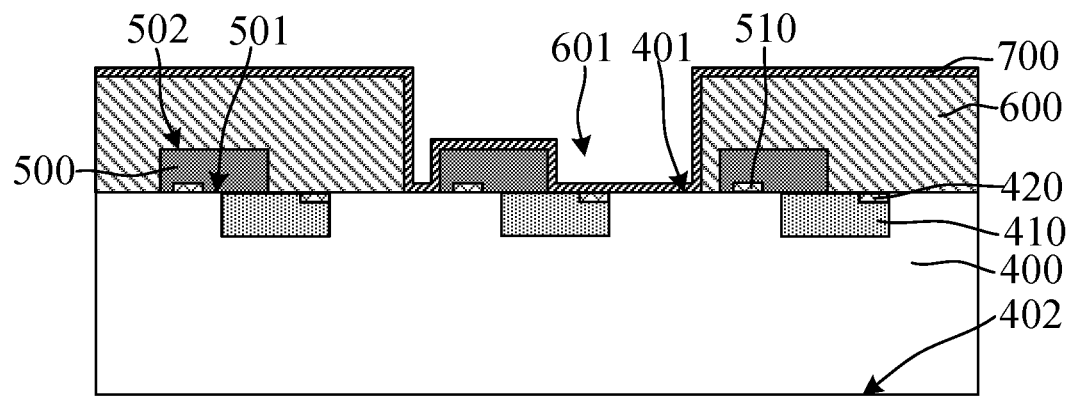

Referring to FIG. 9, a metal layer structure 700 may be formed by covering the first chip 500 exposed by the opening 601, a bottom and sidewalls of the opening 601 and a top of the first encapsulation layer 600.

In one embodiment, the first chip back surface 502 of the first chip 500 may be used for receiving a loading voltage, so the first chip back surface 502 may be suitable for connecting to the second pad 420 electrically, which may apply voltages to the first chip back surface 502 through the second pad 420.

Correspondingly, during the formation of the metal layer structure 700, the metal layer structure 700 may be further formed on the surface of the second pad 420. The metal layer structure 700 may be connected to the second pad 420 electrically, so the first chip back surface 502 and the second pad 420 may be electrically connected through the metal layer structure 700.

In one embodiment, the metal layer structure 700 may be formed by an electroplating process. Correspondingly, the metal layer structure 700 may conformally cover the first chips 500, the bottom and sidewalls of the opening 601 and the top of the first encapsulation layer 600.

The detailed description of the metal layer structure 700 may refer to the corresponding description in the above-mentioned embodiment. Details may be not described herein.

Figure 10:
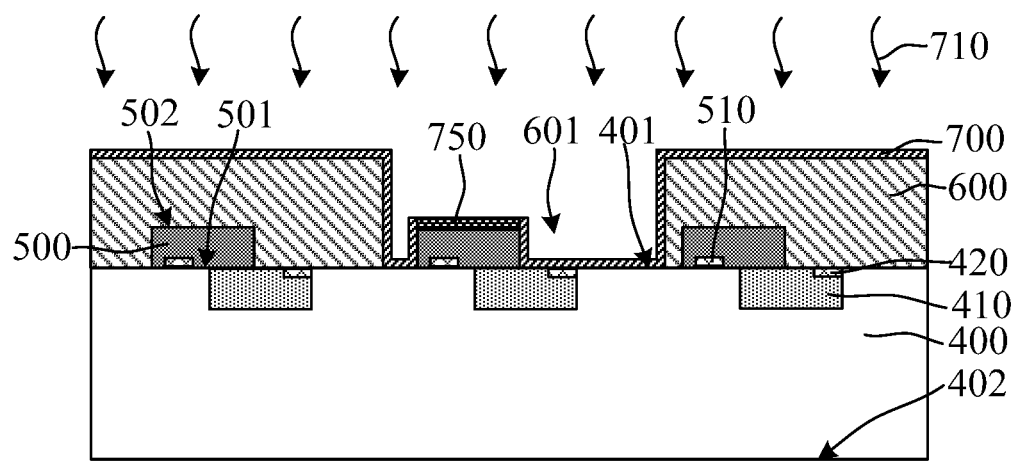
Figure 11:
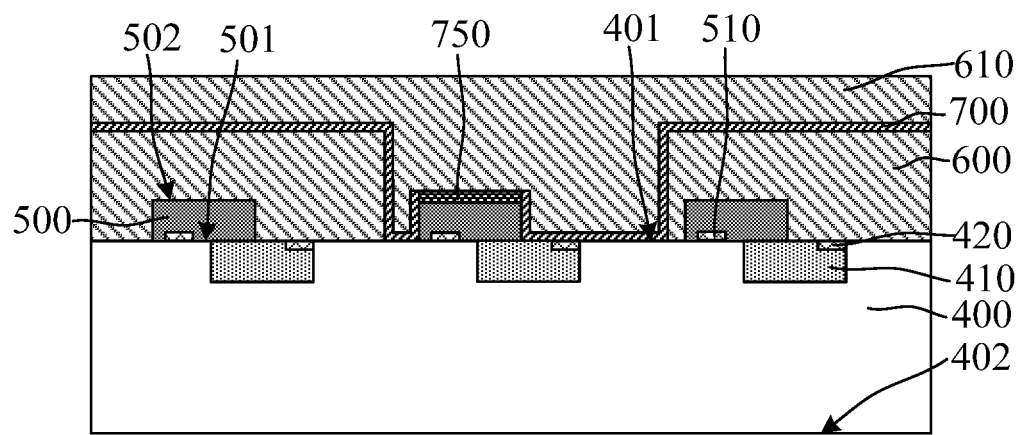

Referring to FIG. 10 and FIG. 11, the first chip back surface 502 and the metal layer structure 700 may perform an alloying treatment 710 (shown in FIG. 10), and the metal layer structure 700 of the first chip back surface 502 may become a back metal layer 750 (shown in FIG. 10); after the alloying treatment 710, a second encapsulation layer 610 (shown in FIG. 11) covering the back metal layer 750 may be formed in the opening 601. The second encapsulation layer 610 may also cover the metal layer structure 700 on the top of the first encapsulation layer 600.

After the alloying treatment 710, a bottom metal layer (not shown) of the metal layer structure 700 and the material of the first chip back surface 502 may mutually diffuse and react each other at a contact surface to form an ohmic contact.

The second encapsulation layer 610 may cover the metal layer structure 700 which is not alloyed and the back metal layer 750. The metal layer structure 700 may be connected to the second pad 420 electrically, so the first chip back surface 502 and external circuits may be connected electrically through the electrical connection between the second pad 420 and external circuits, and voltage signals may be loaded on the first chip back surface 502.

The detailed description of the alloying treatment 710 and the second encapsulation layer 610 may refer to the corresponding description in the above-mentioned embodiment. Details may be not described herein.

Correspondingly, the present disclosure may provide a wafer-level packaging structure. Referring to FIG. 7, it illustrates a structural schematic of an exemplary wafer-level packaging structure of the present disclosure.

The wafer-level packaging structure may include: the device wafer 100; the plurality of first chips 200 bonded to the device wafer 100, where the first chip 200 may include the first chip front surface 201 with the formed first pad 210 and the first chip back surface 202 opposite to the first chip front surface 201, and the first chip front surface 201 may face the device wafer 100; the first encapsulation layer 300 which is on the device wafer 100 and covers the first chips 200, where the first opening 301 (shown in FIG. 5) exposing at least one first chip 200 may be formed in the first encapsulation layer 300 and the first chip back surface 202 exposed by the first opening 301 may be used for receiving a loading signal; the metal layer structure 400 covering the first chip 200 exposed by the first opening 301, the bottom and sidewalls of the first opening 301 and the top of the first encapsulation layer 300, where an alloying treatment may perform on the metal layer structure 400 of the first chip back surface 202 and the first chip back surface 202, and the metal layer structure 400 of the first chip back surface 202 may become a back metal layer 450; and a second encapsulation layer 310, which may be in the first opening 301, may cover the back metal layer 450, and may further cover the metal layer structure 400 on the top of the first encapsulation layer 300.

In one embodiment, the wafer-level packaging structure may be a wafer-level system-in-package packaging structure. The device wafer 100 may integrated in the wafer-level packaging structure.

The device wafer 100 may be the wafer for a device completion. The device wafer 100 may be fabricated using an integrated circuit fabrication technology. For example, a device including an NMOS device or a PMOS device may be formed on a semiconductor substrate including a process including deposition and etching etc., and structures including a dielectric layer, a metal interconnection structure and a pad electrically connected to the metal interconnection structure may be formed on the device.

In one embodiment, the plurality of second chips 110 may be integrated in the device wafer 100 and the second pad 120 may be formed in the second chip 110, where the plurality of the second chips 110 may be the same type or different types of chips.

In one embodiment, the second pad 120 may be a bond pad of the device wafer 100 and may be used to implement an electrical connection between the second chip 110 and other circuits.

It should be noted that, in one embodiment, in order to facilitate illustrations, three second chips 110 integrated in the device wafer 100 are taken as an example for description, but the number of the second chips 110 is not limited to three.

In one embodiment, the device wafer 100 may include a wafer front surface 101 exposing the second pad 120 and a wafer back surface 102 opposite to the wafer front surface 101. The plurality of the first chips 200 may be bonded to the wafer front surface 101 of the device wafer 100. The wafer back surface 102 may refer to a bottom surface, away from the second pad 120, of the semiconductor substrate in the device wafer 100.

The first chips 200 may integrated in the wafer-level packaging structure. The first chips 200 may be one or more components including active components, passive components, microelectromechanical systems, and optical components. For example, the first chips 200 may be memory chips, communication chips, processing chips, flash chips or logic chips. In other embodiments, the first chips may also be other functional chips.

In one embodiment, the plurality of the first chips 200 may be obtained by cutting a plurality of wafers of different functional types. In other embodiments, the functional types of the plurality of the first chips may be the same according to actual processing requirements.

It should be noted that, in one embodiment, the wafer-level packaging method may be used to implement heterogeneous integration, so the plurality of the first chips 200 may be chips made of silicon wafers. In other embodiments, the plurality of the first chips 200 may be also chips made of other suitable materials.

The first chips 200 may have the same number of the second chips 110. The first chips 200 may have a one-to-one correspondence with the second chips 110 and may have preset relative positional relationship. In one embodiment, the projection of the first chip 200 on the device wafer 100 may partially overlap with the second chip 110.

In other embodiments, the first chip may also be aligned with the corresponding second chip, that is, the projection of the first chip on the device wafer may coincide with the second chip.

The first pad 210 may be formed in the first chip 200. The first chip front surface 201 of the first chip 200 may expose the first pad 210 and the first pad 210 may be used to implement an electrical connection between the first chip 200 and other circuits. In one embodiment, the first pad may be a bond pad.

The first encapsulation layer 300 may cover the first chips 200 and the wafer front surfaces 101 of the device wafer 100, which may be used for sealing and moisture proof. The first encapsulation layer 300 may protect the first chips 200 and the second chips 110, so it may reduce a probability of the first chips 200 and the second chips 110 being damaged, contaminated or oxidized, which may facilitate optimizing of the performance of the obtained wafer-level packaging structure.

In one embodiment, the first encapsulation layer 300 may be made of epoxy resin (Epoxy). Epoxy resin has advantages of low shrinkage, good adhesion, good corrosion resistance, excellent electrical properties and low cost, and is widely used a packaging material for electronic devices and integrated circuits. In other embodiments, the first encapsulation layer may be made of a thermosetting material including polyimide or silica gel.

For example, the first encapsulation layer 300 may be formed by an injection molding process. The first encapsulation layer 300 may have a wafer shape, and a diameter of the wafer-shaped encapsulation layer 300 may be the same as a diameter of the device wafer 100. In other embodiments, the first encapsulation layer may be other suitable shapes.

The first opening 301 may be formed in the first encapsulation layer 300 and may expose the first chip back surface 202 which may be used for receiving a loading signal, so that a position space for forming the back metal layer 450 may be provided. The first opening 301 may be formed by etching the first encapsulation layer 300. In order to reduce the process difficulty of forming the first opening 301, the bottom of the first opening 301 may expose the device wafer 100, so that the wafer front surface 101 may be used as a stop position.

In one embodiment, the back metal layer 450 may be used as an electrode for loading ground signals. The back metal layer 450 may be formed by performing the alloying treatment on the first chip back surface 202 and the metal layer structure 400 of the first chip back surface 202, so itself resistance of the first chip 200 and a contact resistance of the electrode may be small, and a ground resistance may be reduced correspondingly, which may reduce the loss of electrical energy and improve the performance and reliability of the wafer-level packaging structure.

In order to improve the performance of the back metal layer 450 and reduce the adverse effect on the first chip 200, the metal layer structure 400 may have low contact resistance and thermal resistance, low thermal stress and high reliability. Furthermore, in order to ensure good electrical performance, the metal layer structure 400 may have good conductive performance and may be capable of forming an ohmic contact with the first chip back surface 202.

In one embodiment, the metal layer structure 400 may be a multiple-layered metal structure, so that the properties of different metals may be utilized to make the back metal layer 450 meet process requirements.

FIG. 4 may be an enlarged view of the metal layer structure. The metal layer structure 400 may include a bottom metal layer 410, a transition metal layer 420 on the bottom metal layer 410, and a top metal layer 430 on the transition metal layer 420.

The material of the bottom metal layer 410 may be a low potential barrier material and the contact resistance with the first chip back surface 202 may be small. The material of the bottom metal layer 410 and the material of the first chip back surface 202 may have good wettability, which may be used as an ohmic contact layer.

In one embodiment, the material of the bottom metal layer 410 may be Ti. Ti and the material of the first chip back surface 202 may have good wettability, which may form an ohmic contact easily and may have low process difficulty to form high purity Ti. Therefore, selecting Ti as the material of the bottom metal layer 410 may also lower the process difficulty to form the metal layer structure 400. Furthermore, the chemical and mechanical properties of Ti may be relatively stable and the material of the first chip back surface 202 may have a good thermal matching with Ti, which may significantly improve the performance and reliability of the wafer-level packaging structure.

In other embodiments, the bottom metal layer may also be made of a material including Cr, Al, V, or a combination thereof.

The greater the thickness of the bottom metal layer 410, the greater the resistance of the bottom metal layer 410. Therefore, the thickness of the bottom metal layer 410 may not be too large, otherwise the performance and reliability of the wafer-level packaging structure may be reduced easily and process resources may be wasted. However, the thickness of the bottom metal layer 410 may not be too small. If the thickness of the bottom metal layer 410 is too small, the quality and the performance of the back metal layer 450 may be reduced, and the performance and reliability of the wafer-level packaging structure may be reduced correspondingly. In one embodiment, the thickness of the bottom metal layer 410 may be of about 1000 Å to 5000 Å.

The top metal layer 420 may have features of low resistivity, strong anti-electromigration performance, stable performance and difficulty in oxidation etc., so the top metal layer may function as a conductive layer, may protect the transition metal layer 420 and reduce the oxidation probability of the transition metal layer 420.

In one embodiment, the material of the top metal layer 420 may be Ag. Ag may be a material which is commonly used in the process and has a low cost. Therefore, Ag may be selected as the material of the top metal layer 420, which may reduce the process difficulty and process cost.

In other embodiments, the material of the top metal layer may also be Au.

The thickness of the top metal layer 430 may be relatively large, which may effectively improve the protection on the transition metal layer 420 and may improve the reliability of the back metal layer when a ground signal is loaded on the back metal layer 450, so performance stability of the wafer-level packaging structure may be improved; however, the thickness of the top metal layer 430 may not be too large. If the thickness of the top metal layer 430 is too large, the resistance of the top metal layer 430 may be too large, which may reduce the performance and reliability of the wafer-level packaging structure and may waste process resources. In one embodiment, the thickness of the top metal layer 430 may be of about 1000 Å to about 50000 Å.

The transition metal layer 420 may block the diffusion of the material of the top metal layer 430 into the bottom metal layer 410, and the expansion coefficient of the transition metal layer 420 may be between the expansion coefficients of the top metal layer 430 and the bottom metal layer 410. The transition metal layer may have moderate electrical conductivity and thermal conductivity, which may achieve a good thermal matching. In addition, the transition metal layer 420 may have good adhesion with the bottom metal layer 410 and the top metal layer 430, which may have the advantage of the improvement of the formation quality of the metal layer structure 400 and the reduced probability of falling off between the metal layers. In one embodiment, the material of the transition metal layer 420 may be Ni.

Correspondingly, in order to perform a good thermal matching and blocking effect of the transition metal layer 420, the thickness of the transition metal layer 420 may greater than the thickness of the bottom metal layer 410 and the thickness of the transition metal layer 420 may be less than the thickness of the top metal layer 430. In one embodiment, according to the thicknesses of the bottom metal layer 410 and the top metal layer 430, the thickness of the transition metal layer 420 may be of about 1000 Å to about 5000 Å.

In one embodiment, the back metal layer 450 may be formed by performing the alloying treatment on the first chip back surface 202 and the metal layer structure 400 of the first chip back surface 202, so the back metal layer 450 may also include a bottom metal layer 410, a transition metal layer 420 on the bottom metal layer 410, and a top metal layer 430 on the transition metal layer 420, and the alloying treatment may be performed on the bottom metal layer 410 and the first chip back surface 202 and the contact surface between the bottom metal layer 410 and the first chip back surface 202 may contain an alloy (not shown).

For example, the material of the bottom back metal layer 410 may be Ti. The semiconductor substrate of the first chip 200 may be a silicon substrate. Correspondingly, the contact surface between the bottom metal layer 410 and the first chip back surface 202 may contain the TiSi alloy to form an ohmic contact.

In one embodiment, the metal layer structure 400 may conformally cover the first chip 200, the bottom and sidewalls of the first opening 301 and the top of the first encapsulation layer 300. In other embodiments, the metal layer structure may also be filled in the first opening.

The second encapsulation layer 310 may be used to protect the metal layer structure 400 and the back metal layer 450, which may prevent an external environment from affecting the metal layer structure 400 and the back metal layer 450 and further avoid an impact on the performance of the wafer-level packaging structure.

In one embodiment, the first chip back surface 202 exposed by the first opening 301 may be used for receiving a loading ground signal. The wafer-level packaging structure may further include: the second opening 311, exposing the back metal layer 450, in the second encapsulation layer 310.

The electrical connection between the back metal layer 450 and other circuits may be achieved through exposing the back metal layer 450 by the second opening 311.

In one embodiment, the second opening 311 may expose a portion surface of the back metal layer 450. In other embodiments, according to the actual process, the second opening may expose the entire surface of the back metal layer.

The detailed description of the second encapsulation layer 310 may refer to the corresponding above-mentioned description of the first encapsulation layer 300, and details may be not described herein.

It should be noted that, in one embodiment, the device wafer 100 may be the wafer after the thinning treatment, and the device wafer 100 after the thinning treatment may have the formed silicon through hole interconnection structure (not shown), which may be electrically connected to the second chip 110. In one embodiment, details may not be described herein.

In one embodiment, the wafer-level packaging structure may be formed using the wafer-level packaging method described in the first embodiment or may be formed using other packaging methods. In one embodiment, the detailed description of the wafer-level packaging structure may refer to the corresponding description in the above-mentioned embodiments, and details may be not described herein.

FIG. 11 illustrates a structural schematic of another exemplary wafer-level packaging structure of the present disclosure.

The similarity between the present embodiment and the previous embodiment may be not described herein. The difference between the present embodiment and the previous embodiment is: a loading signal may be a voltage signal.

Correspondingly, the opening 601 (shown in FIG. 10) in the first encapsulation layer 600 may expose the second pad 420, and the metal layer structure 700 may on the surface of the second pad 420.

The metal layer structure 700 and the second pad 420 may be connected electrically, so the first chip back surface 502 and the second pad 420 may be electrically connected through the metal layer structure 700, and voltages may be loaded on the back metal layer 700 through the second pad 420 and may be loaded on the first chip back surface 502.

In one embodiment, the wafer-level packaging structure may be formed using the wafer-level packaging method described in the second embodiment or may be formed using other packaging methods. In one embodiment, the detailed description of the wafer-level packaging structure may refer to the corresponding description in the above-mentioned embodiments, and details may be not described herein.

In the present disclosure, the wafer-level packaging method may include: after etching a first encapsulation layer to expose a chip back surface of a first chip which is used for receiving a loading signal, forming a metal layer structure covering the first chip exposed by the first opening, a bottom and sidewalls of the first opening and a top of the first encapsulation layer; performing an alloying treatment on the chip back surface and the metal layer structure where the metal layer structure on the chip back surface is used as a back metal layer; and forming a second encapsulation layer covering the back metal layer. The back metal layer may be used as a back electrode of the first chip, which may load a signal (for example a ground signal) on the chip back surface suitable for receiving the loading signals according to actual process requirements, and may further improve the performance of wafer-level packaging structures.

Optionally or additionally, in the present disclosure, a plurality of second chips are formed in the device wafer and a second pad is formed on a surface of the second chip of the plurality of second chips facing the first chip; after etching the first encapsulation layer, the first opening exposes the second pad and the metal layer structure is also formed on a surface of the second pad. The electrical connection between the chip back surface of the first chip and the second chip may be achieved by the metal layer structure and the back metal layer, so a voltage signal may be applied to the chip back surface through the second chip.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. The wafer-level packaging structure, comprising:
  a device wafer;
  a plurality of first chips, bonded to the device wafer, wherein the first chip of the plurality of first chips includes a chip front surface with a formed first pad and a chip back surface opposite to the chip front surface, and the chip front surface faces the device wafer;

a first encapsulation layer, formed on the device wafer and covering the first chips, wherein the first encapsulation layer has a first opening exposing at least one first chip of the plurality of first chips and the chip back surface exposed by the first opening is connected to a loading signal;

a metal layer structure, covering the at least one first chip exposed by the first opening, a bottom and sidewalls of the first opening and a top of the first encapsulation layer, wherein the metal layer structure includes a back metal layer alloyed with the chip back surface by an alloying treatment between the chip back surface and a portion of the metal layer structure on the chip back surface; and a second encapsulation layer, formed in the first opening, covering the back metal layer, and further covering the metal layer structure on the top of the first encapsulation layer.

2. The structure according to claim 1, wherein:
the loading signal is one of a ground signal and a voltage signal.

3. The structure according to claim 1, wherein:
the loading signal is a ground signal; and
the second encapsulation layer contains a second opening therein to expose the back metal layer.

4. The structure according to claim 1, wherein:
the loading signal is a voltage signal;
a plurality of second chips are formed in the device wafer and a second pad is formed on a surface of the second chip of the plurality of second chips facing the first chip;
the first opening exposes the second pad; and
the metal layer structure is also formed on a surface of the second pad.

5. The structure according to claim 1, wherein:
the metal layer structure includes a bottom metal layer, a transition metal layer on the bottom metal layer and a top metal layer on the transition metal layer.

6. The structure according to claim 5, wherein:
the bottom metal layer is made of a material including Ti, Cr, Al, V, or a combination thereof;
the transition metal layer is made of a material including Ni; and
the top metal layer is made of a material including Ag, Au, or a combination thereof.

7. The structure according to claim 5, wherein:
a thickness of the bottom metal layer is of about 1000 Å to about 5000 Å;
a thickness of the transition metal layer is of about 1000 Å to about 5000 Å; and
a thickness of the top metal layer is of about 1000 Å to about 50000 Å.

* * * * *